United States Patent
Chen et al.

(10) Patent No.: US 8,502,689 B2
(45) Date of Patent: Aug. 6, 2013

(54) SYSTEM AND METHOD FOR VOLTAGE-BASED PLASMA EXCURSION DETECTION

(75) Inventors: Jian J. Chen, Fremont, CA (US); Mohamad Ayoub, Las Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 389 days.

(21) Appl. No.: 12/888,790

(22) Filed: Sep. 23, 2010

(65) Prior Publication Data

US 2012/0075108 A1    Mar. 29, 2012

(51) Int. Cl.
   *G08B 21/00*    (2006.01)

(52) U.S. Cl.
   USPC ............... 340/661; 340/660; 340/657

(58) Field of Classification Search
   None
   See application file for complete search history.

(56) References Cited

U.S. PATENT DOCUMENTS

| | | | |
|---|---|---|---|
| 5,855,681 A | 1/1999 | Maydan et al. | |
| 6,878,636 B2 | 4/2005 | Bailey et al. | |
| 7,199,327 B2 * | 4/2007 | Moroz et al. | 219/121.41 |
| 7,628,863 B2 | 12/2009 | Sen et al. | |
| 7,640,120 B2 | 12/2009 | Axenbeck et al. | |
| 7,745,328 B2 | 6/2010 | Yim et al. | |
| 7,761,247 B2 | 7/2010 | van Zyl | |
| 7,767,053 B2 | 8/2010 | Takeda et al. | |
| 7,768,269 B2 | 8/2010 | Pipitone et al. | |
| 2004/0182697 A1 | 9/2004 | Buda | |
| 2006/0081564 A1 * | 4/2006 | Moroz et al. | 219/121.43 |
| 2007/0042131 A1 | 2/2007 | Soo et al. | |
| 2007/0073498 A1 | 3/2007 | Winterhalter et al. | |
| 2008/0021664 A1 | 1/2008 | Krauss et al. | |

FOREIGN PATENT DOCUMENTS

| | | |
|---|---|---|
| JP | 2003-234332 A | 8/2003 |
| JP | 2006-507662 A | 3/2006 |
| JP | 2009-505441 A | 2/2009 |
| KR | 10-2008-0107824 | 12/2008 |
| KR | 10-2009-0042576 | 4/2009 |
| WO | WO-2004-003968 | 1/2004 |

OTHER PUBLICATIONS

International Search Report and Written Opinion dated Mar. 2, 2012 for PCT Application No. PCT/US2011/048553.

* cited by examiner

*Primary Examiner* — Travis Hunnings
(74) *Attorney, Agent, or Firm* — Patterson & Sheridan, LLP

(57) ABSTRACT

The present invention provides a system and method for the detection of plasma excursions, such as arcs, micro-arcs, or other plasma instability, during plasma processing by directly monitoring direct current (DC) bias voltage on an RF power electrode of a plasma processing chamber. The monitored DC bias voltage is then passed through a succession of analog filters and amplifiers to provide a plasma excursion signal. The plasma excursion signal is compared to a preset value, and at points where the plasma excursion signal exceeds the preset value, an alarm signal is generated. The alarm signal is then fed back into a system controller so that an operator can be alerted and/or the processing system can be shut down. In certain embodiments, multiple processing regions can be monitored by a single detection control unit.

18 Claims, 7 Drawing Sheets

SYSTEM AND METHOD FOR VOLTAGE-BASED PLASMA EXCURSION DETECTION

BACKGROUND OF THE INVENTION

1. Field of the Invention

Embodiments of the present invention generally relate to a system and method for the detection of plasma excursions, such as arcs, micro-arcs, or other plasma instability, during plasma processing.

2. Description of the Related Art

During plasma processing of substrates, such as plasma etch, plasma enhanced chemical vapor deposition (PECVD), or physical vapor deposition (PVD), plasma excursions, such as arcs, micro-arcs, or other plasma instability, occurs sporadically and unpredictably. In addition, the requirements of certain processes substantially increase the probability of electrical breakdown and plasma excursions. Such plasma excursions result in shifted process results, reduced product yield, and increased system downtime. Thus, detection of plasma excursions during plasma processing of substrates is desired to better define and control process conditions having fewer plasma excursions.

Prior art attempts at detecting plasma excursions, such as arcing, involves measuring the radio frequency (RF) waveform generated at or near an RF power supply or between the RF power supply and an RF matching network positioned between the RF power supply and the plasma load of a processing chamber. The RF waveform is typically measured in analog form and digitized, followed by digital signal processing. It has been found that such prior art methods have an overall sampling rate in the millisecond range, which is too slow to detect and resolve arcs or micro-arcs that occur within a few microseconds. It has also been found that prior art plasma excursion detection methods are susceptible to delay and distortion, resulting in poor recognition of a substantial amount of plasma instabilities. Therefore, improved plasma excursion detection apparatus and methods are needed to overcome the shortcoming of the prior art.

SUMMARY OF THE INVENTION

In one embodiment, a method for detecting plasma excursions in a plasma chamber comprises directly sensing a bias voltage from a radio frequency (RF) powered electrode within the plasma chamber during plasma processing, filtering the bias voltage using a plurality of analog filters to obtain an output voltage signal, comparing the output voltage signal to a preset voltage value that represents a plasma excursion event, and generating an alarm signal if the output voltage signal exceeds the preset voltage value.

In another embodiment, a system for detecting plasma excursions in a plasma chamber comprising one or more voltage probes and a plasma excursion detection unit is provided. Each voltage probe is configured to attach to a radio frequency electrode within a plasma chamber and sense a bias voltage of the radio frequency electrode during plasma processing. The plasma excursion detection unit comprises one or more excursion detection modules, one or more connection ports, and a data acquisition module. Each excursion detection module is configured to receive the bias voltage from one of the one or more voltage probes. Each excursion detection module comprises a plurality of analog filters arranged to filter the bias voltage to obtain an output voltage signal and a comparator configured to compare the output voltage signal to a preset voltage signal and generate an alarm signal if the output voltage signal exceeds the preset voltage signal. The one or more connection ports are configured to receive the preset voltage signal from a host controller and configured to send the alarm signal to the host controller. The data acquisition module is configured to collect and transfer the output voltage signal from each of the one or more excursion detection modules to a data logging and diagnostic system.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a system and method for the detection of plasma excursions, such as arcs, micro-arcs, or other plasma instability, during plasma processing by directly monitoring direct current (DC) bias voltage on an RF power electrode of a plasma processing chamber. The monitored DC bias voltage is then passed through a succession of analog filters and amplifiers to provide a plasma excursion signal. The plasma excursion signal is compared to a preset value, and at points where the plasma excursion signal exceeds the preset value, an alarm signal is generated. The alarm signal is then fed back into a system controller so that an operator can be alerted and/or the processing system can be shut down. In certain embodiments, multiple processing regions can be monitored by a single detection control unit.

Figure 1:
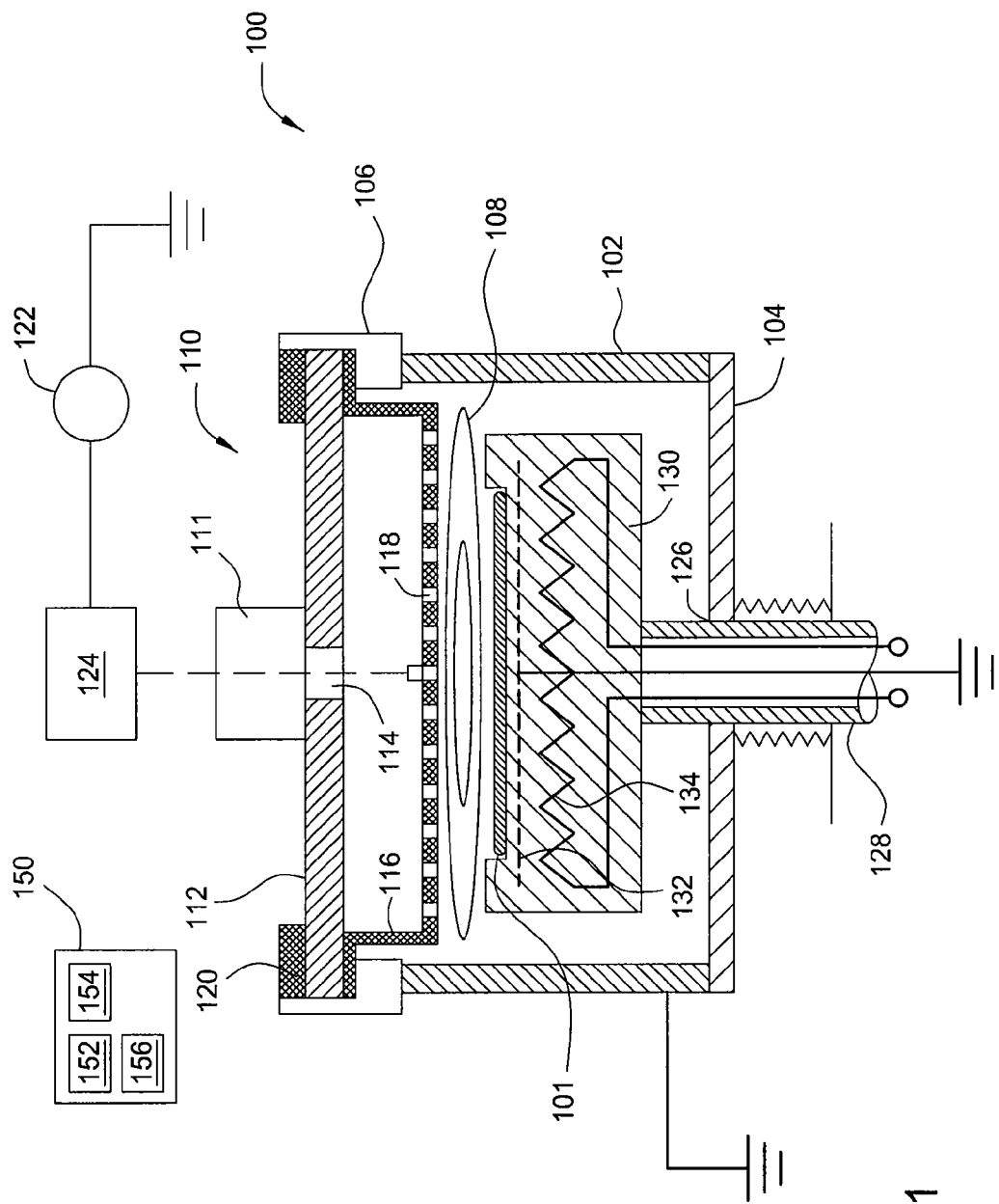
FIG. 1 is a schematic, cross-sectional view of a PECVD chamber on which the present invention may be used.

FIG. 1 is a schematic, cross-sectional view of a PECVD chamber 100 on which the present invention may be used. The PECVD chamber 100 includes sidewalls 102, a bottom wall 104, and a chamber lid 106, which cumulatively define a processing region 108. A gas distribution system 110 is disposed through the chamber lid 106 to deliver gases into the processing region 108. The gas distribution system 110 includes a gas box 112 with a gas inlet 114 that receives processing gases from a precursor source 111 and that introduces processing gases into the gas box 112. The gas distribution system 110 also includes a showerhead 116 having a plurality of gas passages 118 for distributing the processing gases from the gas box 112 into the processing region 108. The gas distribution system 110 may also include a gas box heater 120, such as a ring-shaped, resistive heater, to heat processing gases to a desired temperature.

The showerhead 116 is coupled to an RF power supply 122 to provide electrical energy to the showerhead 116 to facilitate plasma formation in the processing region 108. Thus, the showerhead 116 acts as an upper, powered electrode. An auto-tuned RF matching network 124 is positioned between the RF power supply 122 and the showerhead 116. In one embodiment, the RF power is supplied at a frequency of about 13.56 MHz.

The bottom wall 104 defines a passage 126 for a stem 128 that supports a pedestal heater 130. The pedestal heater 130 is configured to support a substrate 101 in the processing region 108. The pedestal heater 130 includes a ground mesh 132 embedded therein, which is connected to an RF ground. Thus, the ground mesh 132 acts as a ground electrode to facilitate plasma formation in the processing region 108 between the showerhead 116 and the pedestal heater 130. The pedestal heater 130 also includes one or more heating elements 134, such as resistive heating elements, to heat the substrate 101 to a desired processing temperature.

A control system 150 including a central processing unit (CPU) 152, a memory 154, and support circuits 156, is coupled to the various components of the chamber 100 to facilitate control of processing within the chamber 100. The memory 154 can be any computer-readable medium, such as random access memory (RAM), read only memory (ROM), floppy disk, hard disk, or any other form of digital storage, local or remote to the chamber 100 or CPU 152. The support circuits 156 are coupled to the CPU 152 for supporting the CPU 152 in a conventional manner. These circuits include cache, power supplies, clock circuits, input/output circuitry and subsystem, and the like. A software routine or a series of program instructions store in the memory 154, when executed by the CPU 152, causes the chamber 100 to perform plasma processes therein.

Deposition chambers that may benefit from the present invention include chambers configured to deposit oxides, such as carbon-doped silicon oxides, silicon containing films, and other dielectric materials including advanced patterned films (APF). An example of a deposition chamber is the PRODUCER® chamber available from Applied Materials, Inc. of Santa Clara, Calif. The PRODUCER® chamber is a PECVD chamber with two isolated processing regions that may be used to deposit carbon-doped silicon oxides and other materials. Further details of an exemplary chamber useful for the present invention is described in U.S. Pat. No. 5,855,681, which is incorporated by reference herein. Although the chamber 100 is schematically depicted as a PECVD chamber, use of the invention may be equally affective on other chambers, such as plasma etch or PVD chambers.

Figure 2:
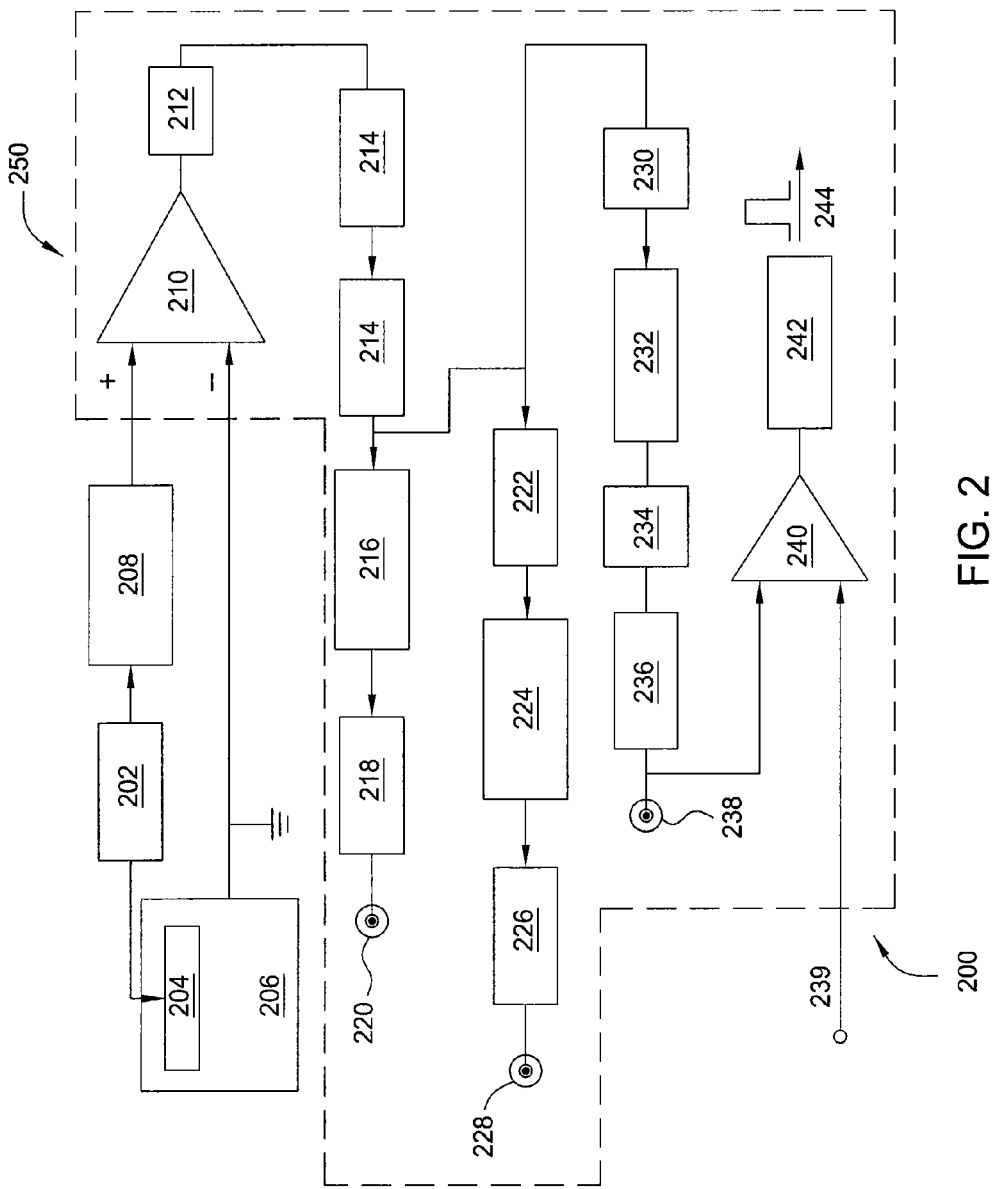
FIG. 2 is a schematic, block diagram of voltage-based plasma excursion detection circuit according to one embodiment of the invention.

FIG. 2 is a schematic, block diagram of a voltage-based plasma excursion detection circuit 200 according to one embodiment of the invention. The detection circuit 200 includes a high voltage probe 202 that is directly attached to an upper, powered electrode 204 within a plasma chamber 206, such as the showerhead 116 in the PECVD chamber 100 depicted in FIG. 1. The voltage probe 202 is directly coupled to the powered electrode 204 in order to directly detect the voltage at the powered electrode 204 during plasma processing within the chamber 206. Detecting the voltage directly at the powered electrode 204 allows much more sensitive plasma excursion detection as opposed to detection at or near the RF power generator or the RF matching network (FIG. 1), which is the convention in the art, as previously discussed. For instance, the powered electrode 204, because of its large size and location with respect to the plasma within the chamber 206, acts like a large antenna that picks up very small electromagnetic glitches, such as micro-arcs within the chamber 206, that are typically undetectable using conventional systems and methods.

In one embodiment, the voltage probe 202 is adapted to withstand temperatures up to and exceeding about 160° C. in order to withstand temperatures at the powered electrode 204. The voltage probe 202 may be configured with a voltage divider, such as a 100:1 voltage divider, to convert the high voltage detected at the powered electrode 204 to within a range of ±15 V for suitability with downstream instrumentation. Next, the reduced voltage is filtered by an RF filter 208 (e.g., block frequencies exceeding about 70 kHz) to provide a DC bias signal, which is defined as the voltage from the voltage probe 202 averaged over a few RF cycles. Next, the DC bias signal is amplified by a differential amplifier 210, such as an instrumentation amplifier. The positive terminal of the differential amplifier 210 is connected to the DC bias signal, and the negative terminal of the differential amplifier 210 is connected to the chamber ground as shown in FIG. 2. In the differential amplifier 210, the common-mode noise (e.g., RF induced noise) that may be present on the positive and negative terminals of the differential amplifier 210 is rejected. A fast buffer 212 is positioned after the differential amplifier 210 to provide both isolation and signal relay buffering for the next stage of signal processing in the circuit 200.

Next, the DC bias signal from the fast buffer 212 is passed through one or more notch filters 214. In one embodiment, the notch filter 214 is a 60 Hz notch filter. In one embodiment, the notch filter 214 is a 50 Hz notch filter. Alternatively, the notch filter 214 may include both a 60 Hz notch filter and a 50 Hz notch filter. Because the powered electrode 204 acts like a large receiving antenna, it directly picks up unwanted 60 Hz (North America) or 50 Hz (Europe/Japan) noise from heaters present in the chamber 206, such as the gas box heater 120 or the pedestal heater 130 depicted in the chamber 100 of FIG. 1. This unwanted noise is passed to the DC bias signal and removed by the notch filter(s) 214. The filtered DC bias signal may then be passed through a low pass filter 216, such as a fourth order low pass filter (e.g., block frequencies exceeding about 50 kHz), and amplifier 218 to provide a filtered DC bias output signal 220. The filtered DC bias output signal 220 may provide an intermediate diagnostic signal for visualization of the original DC bias signal.

In one embodiment, the DC bias signal from the notch filter(s) 214 may be transferred to a fast buffer 222, which provides isolation and signal buffering for the subsequent signal processing. The DC bias signal is then passed through a low pass filter 224, such as a fourth order low pass filter, which is configured significantly lower than the low pass filter 216 (e.g., block frequencies exceeding about 250 Hz). After passing through the low pass filter 224, the signal is amplified by an amplifier 226 to provide a slow DC bias output signal 228. The slow DC bias output signal 228 may provide an intermediate diagnostic signal for visualization of the slow drift DC bias level.

Plasma excursion within the chamber 206, such as an arc, is received by the voltage probe 202 through the powered electrode 204. The plasma arc generates a spike (i.e., alternating current (AC) component) in the DC bias signal. The filtered DC bias output signal 220 can be monitored for these spikes, which correspond to plasma instability in the chamber 206. However, the powered electrode 204 also picks up other AC components generated in the chamber 206, such as on/off switching of heating elements. Thus, these additional AC components in the raw DC bias may show up in the filtered DC bias output 220, making detection of plasma instability difficult to discern. Therefore, additional filtering is needed for more reliable plasma excursion detection.

In one embodiment, the DC bias signal from the notch filter(s) 214 passes to a fast buffer 230 for isolation and signal buffering prior to further signal processing. The DC bias signal then passes through an analog band pass filter 232 having a pass band specifically designed to detect fast plasma excursion events, such as on a time scale of between about 10 µs and about 1 ms. For instance, the pass band of the band pass filter 232 may have a low cut off of about 250 Hz and a high cutoff of about 50 kHz. The DC bias signal then passes through a high pass filter 234 and an amplifier 236 to provide an excursion output signal 238. The high pass filter 234 provides further AC coupling and removes any DC offset prior to amplification in the amplifier 236. Thus, the excursion output signal 238 provides a signal with additional filtering such that any spikes in the DC bias are clearly detectable without distortion from AC noise within the chamber 206. Therefore, the excursion output signal 238 can be used to detect any excursion, or plasma instability, within the chamber 206, such as arcs or micro-arcs.

In one embodiment, the excursion output signal 238 is fed into a comparator 240, where the value of the excursion output signal 238 is compared with a preset value 239, such as that supplied by a user or programmed into the control system 150 (FIG. 1). If the excursion output signal 238 exceeds the preset value 239 within a very short time period (e.g., 1 ms), the comparator 240 passes a signal to an analog to digital converter 242 to generate a digital alarm signal 244 to flag the spike or plasma excursion. The alarm signal 244 can be fed back into the control system 150, where an operator can be alerted and/or the processing system can be shut down.

Figure 3:
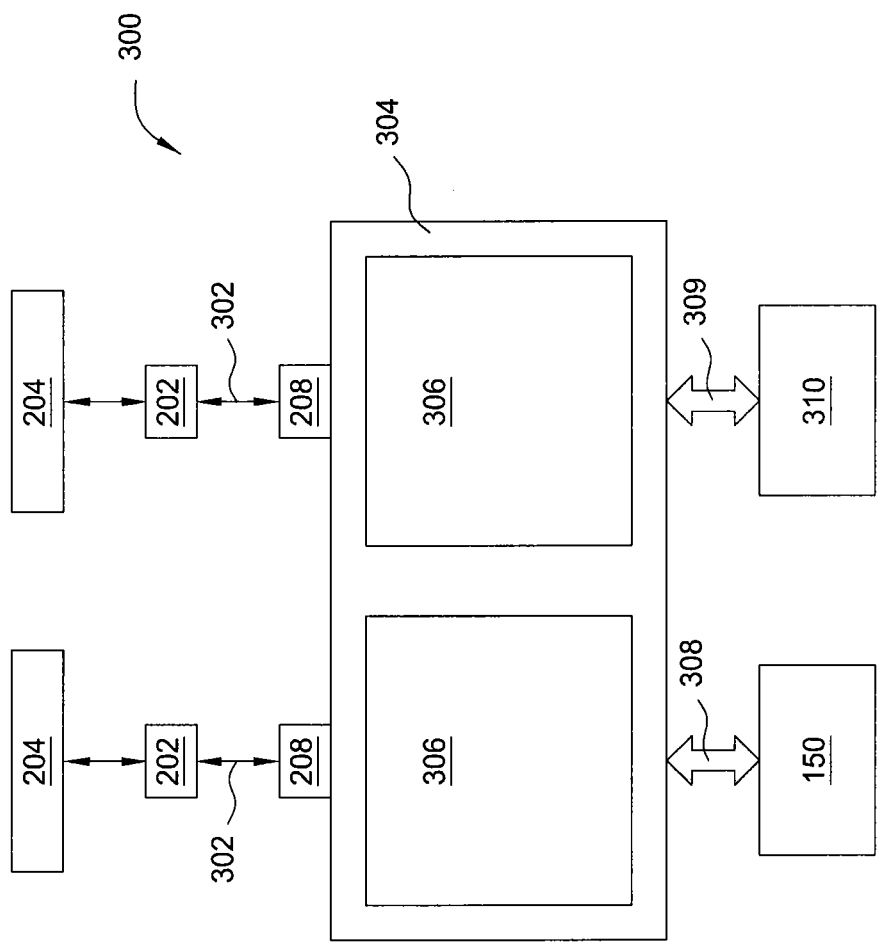
FIG. 3 is a schematic, block diagram of one embodiment of a plasma excursion detection system according to one embodiment.

FIG. 3 is a schematic, block diagram of one embodiment of a plasma excursion detection system 300 using the detection circuit 200 described above. The excursion detection system 300, depicted in FIG. 3, is for use with embodiments where dual processing regions are to be monitored, such as with the PRODUCER® chamber described above. However, single processing region applications are equally applicable.

In processing applications having multiple processing regions to be monitored, the powered electrode 204 within each processing region is separately monitored by a single voltage probe 202. Each voltage probe 202 is connected to the RF filter 208 via cables 302. The voltage signal from each of the RF filters 208 are separately fed into a detection control unit 304 which includes a separate detection module 306 for each processing region to be monitored. The detection modules 306 each contain all of the components of the circuit 200 encircled by the box 250 in FIG. 2 and box 750 in FIG. 7 (subsequently described). The detection control unit 304 includes a connection 308 to the control system 150 for reception of the preset value(s) 239 and output of the digital alarm signal 244 between each of the detection modules 306 and the control system 150. In addition, the detection control unit 304 includes a data acquisition unit and port 309, such as a USB port, that can be connected to a personal computer 310 having data logging and diagnostic software thereon. In one embodiment, the computer 310 continually logs one or more of the filtered DC bias output signal 220, the slow DC bias output signal 228, and the excursion output signal 238 through the data acquisition port 309. In another embodiment, the computer 310 only logs one or more of the filtered DC bias output signal 220, the slow DC bias output signal 228, and the excursion output signal 238 from one of the detection modules 306 through the data acquisition port 309 for diagnostics when the excursion output signal 238 exceeds the preset value 239 and the alarm signal 244 is generated from the corresponding detection module 306. This functionality allows automatic logging and diagnostics to be performed on the magnitude and duration of any plasma excursions generated during plasma processing.

Figure 4:
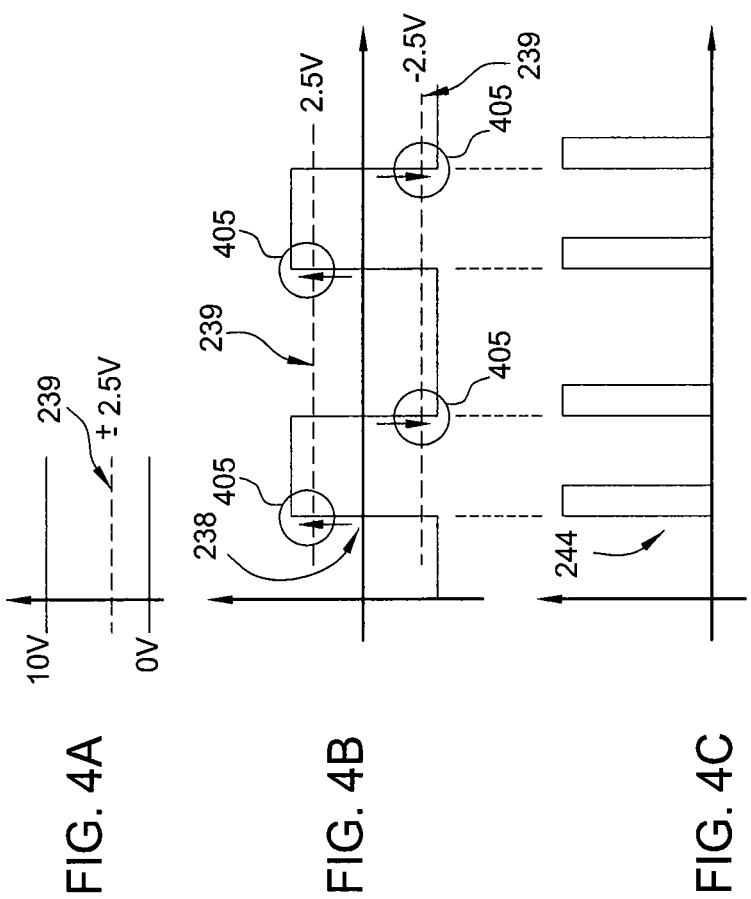
FIGS. 4A-4C are graphical depictions of the function of the comparator of the circuit of FIG. 2.

FIGS. 4A-4C are graphical depictions of the function of the comparator 240 of the circuit 200 of FIG. 2. FIG. 4A is a graphical depiction of the preset value 239 or user programmed trigger level on a scale between 0 V and 10 V. In this example, a preset value of 2.5 V is specified. This preset value is entered in a process recipe and interpreted by the detection control unit 304 as a band limit of ±2.5 V even if a single positive 2.5 V is entered in the system. FIG. 4B is a graphical depiction of the excursion output signal 238 with the preset value 239 overlaid. As denoted at points 405, the excursion output signal 238 exceeds the band limit defined by the preset value 239 at a number of locations (i.e., greater than 2.5 V or less than –2.5 V). FIG. 4C is a graphical depiction of the alarm signal 244 corresponding to the points 405 where the excursion output signal 238 exceeds the band limit defined by the preset value 239.

Figure 5:
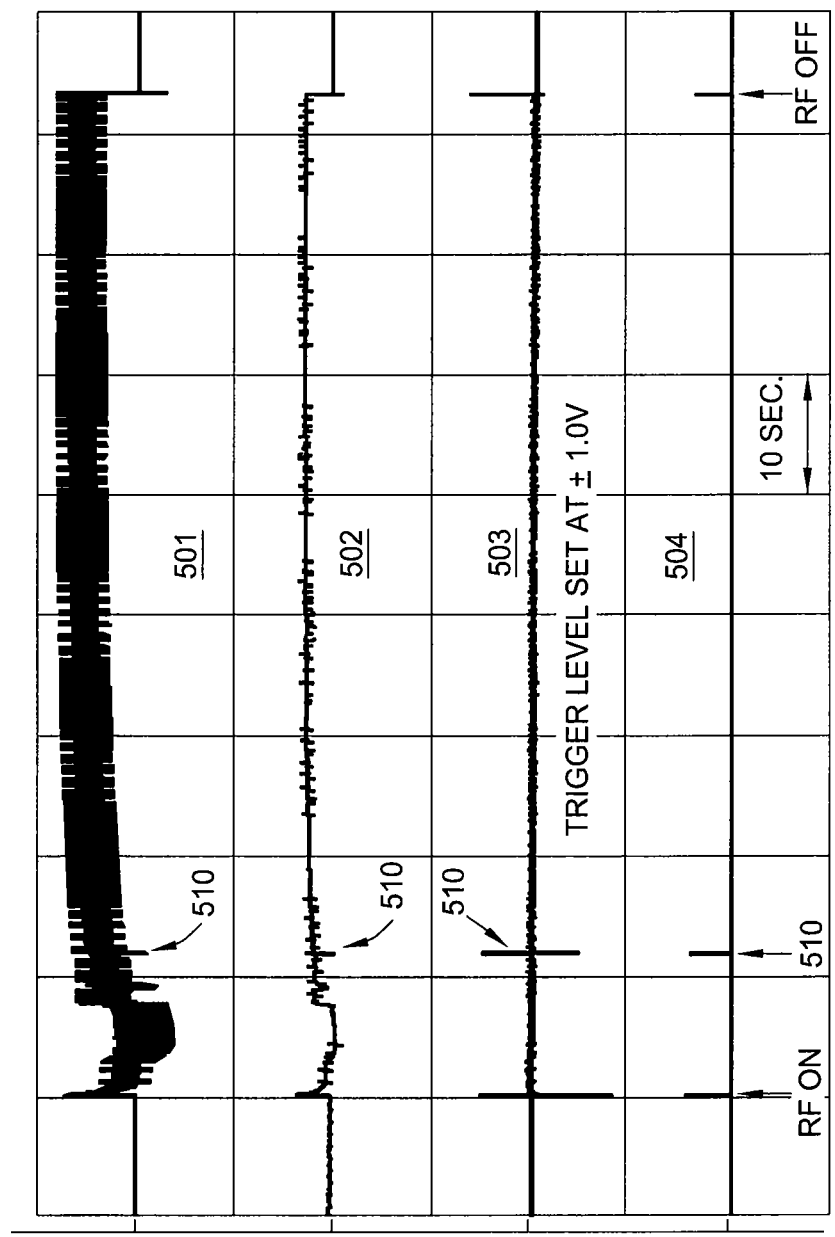
FIG. 5 depicts an example of data logged from the circuit of FIG. 2 compared to raw DC bias data.
Figure 6:
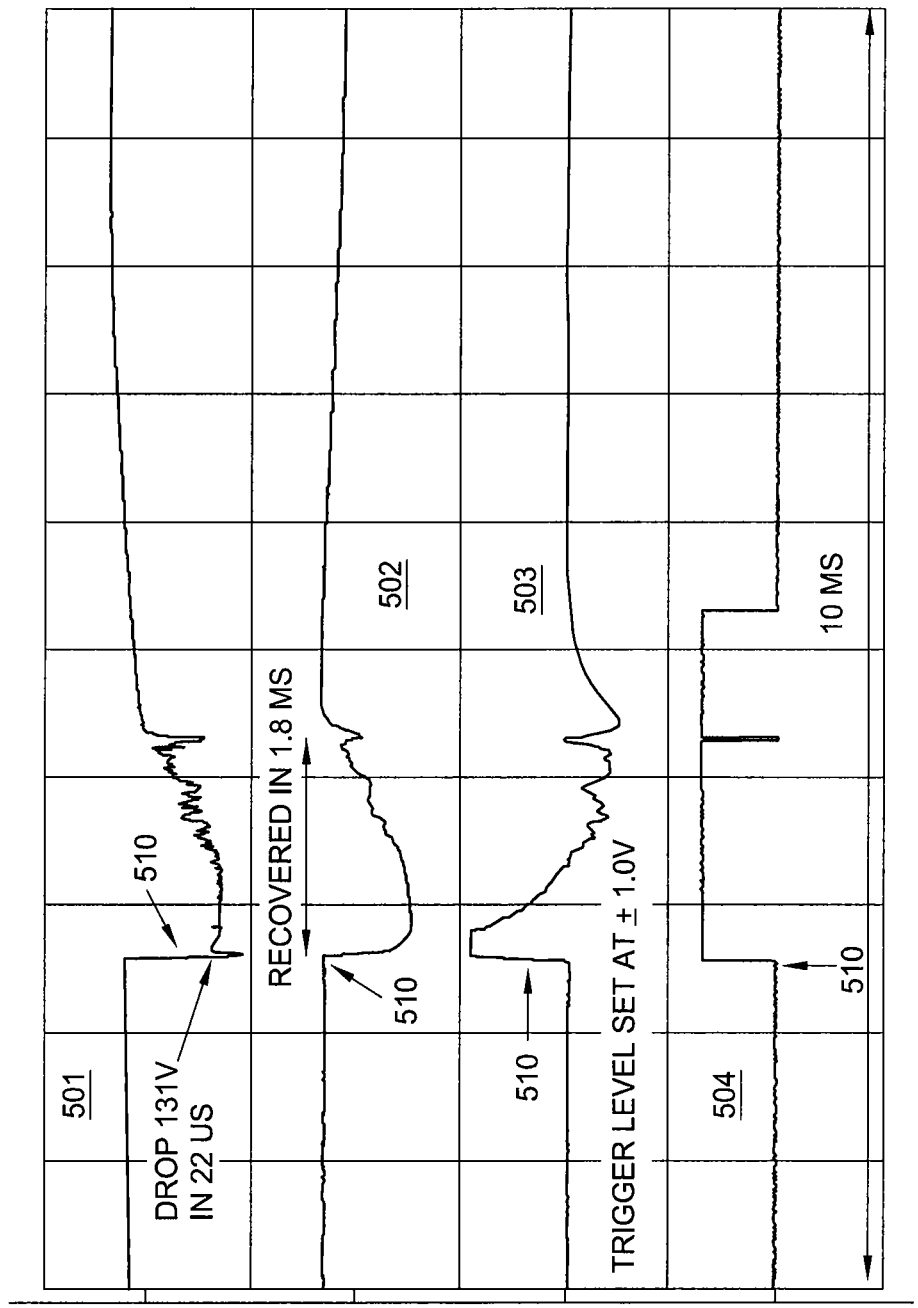
FIG. 6 depicts an enlarged view of a point from FIG. 5 corresponding to a plasma excursion.

FIG. 5 depicts an example of data logged from the circuit 200 compared to raw DC bias data during processing conditions intended to stimulate arcing. Signal 501 is raw DC bias data retrieved directly from a powered electrode 204 without any filtering. Signal 502 is corresponding data output from the filtered DC bias signal 220. Signal 503 is corresponding data from the excursion output signal 238. Signal 504 is the corresponding alarm signal 244. The single spike at point 510 correlates with a physical plasma arc in the chamber during processing. FIG. 6 depicts an enlarged view of the point 510 from FIG. 5.

Referring to FIGS. 5 and 6, as can be seen with regard to the raw signal 501, the noise level in the raw DC bias is significant. This includes both RF noise and other AC component noise picked up by the powered electrode 204 as previously discussed. This noise provides significant distortion, making it difficult to accurately and reliably detect plasma excursions or instabilities. Signal 502 is substantially less distorted because the DC bias signal has been filtered through the RF filter 208 and the notch filter(s) 214. As previously discussed, other AC component signals, such as heater on/off signals, may be present on the filtered DC bias signal 220, as shown in the signal 502, which may make it difficult to accurately and reliably detect plasma excursions. Signal 503, the excursion output signal 238, has substantially no distortion so that the spike at point 510 is easily detected. In this example, the signal 503 well exceeded the preset value 239 of 1.0 V in about 20 µs. Correspondingly, at point 510, the alarm signal was generated to flag the detected plasma excursion. Further, as shown in FIG. 6, each alarm pulse has a fixed pulse width. Thus, multiple alarm signals can be triggered when the arcing persists for an extended period of time.

Figure 7:
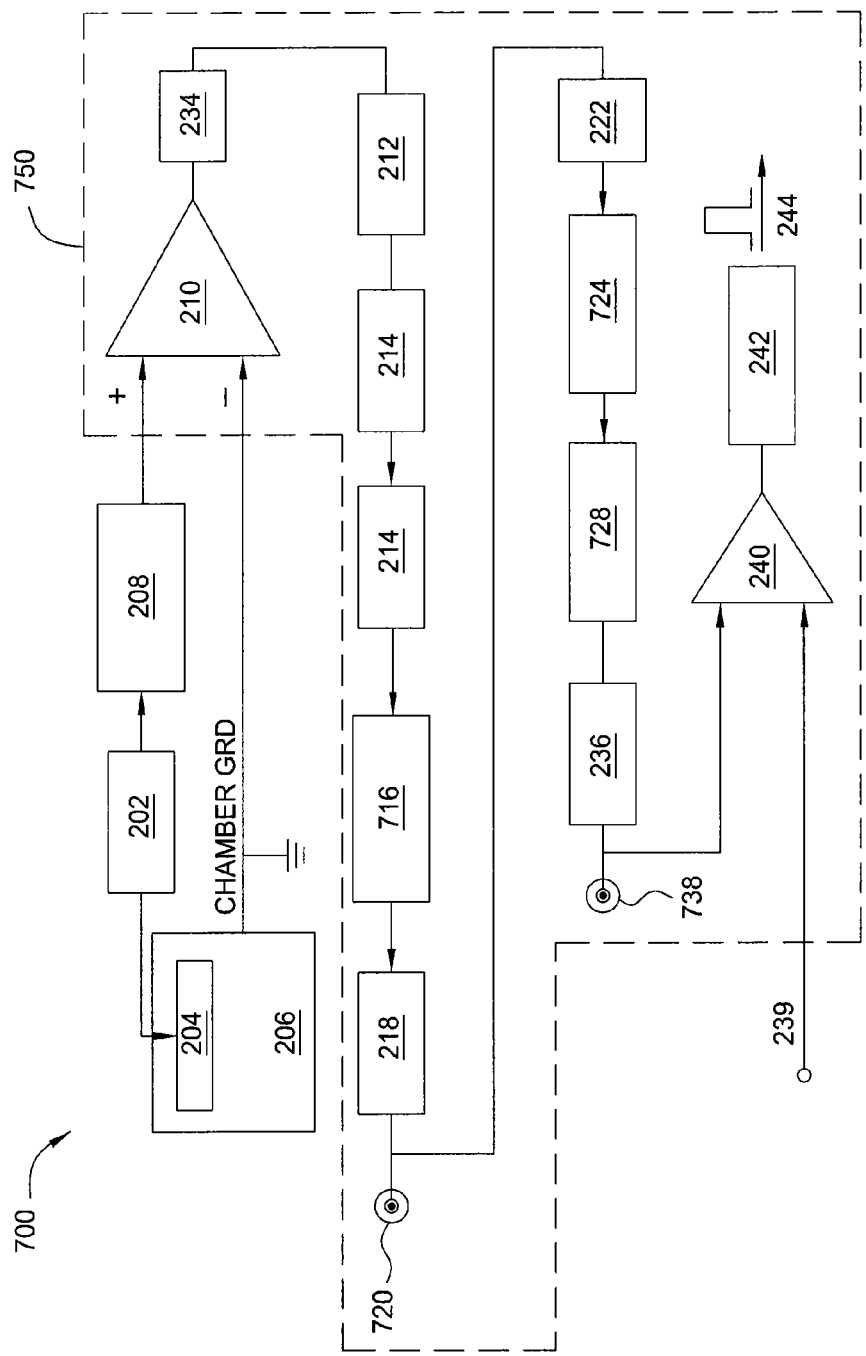
FIG. 7 is a schematic, block diagram of voltage-based plasma excursion detection circuit according to another embodiment.

FIG. 7 is a schematic, block diagram of voltage-based plasma excursion detection circuit 700 according to another embodiment. Many aspects of the excursion detection circuit 700 are the same or similar to those of the excursion detection circuit 200. Thus, identical item numbers will be used in referring to identical components between the two circuits.

The detection circuit 700 includes the high voltage probe 202 that is directly attached to the powered electrode 204. The voltage probe 202 reduces the voltage with a voltage divider, such as a 100:1 voltage divider. The reduced voltage is filtered by the RF filter 208 to provide a DC bias signal. The DC bias signal is amplified by the differential amplifier 210. The positive terminal of the differential amplifier 210 is connected to the DC bias signal, and the negative terminal of the differential amplifier 210 is connected to the chamber ground as shown in FIG. 7. The DC bias signal from the differential amplifier 210 passes through a high pass filter 234, which removes any DC offset or drift in the DC bias signal. Eliminating the DC component in the DC bias at this point has been found to substantially increase the dynamic range for subsequently processing the AC component.

The fast buffer 212 is positioned after the high pass filter 234 to provide both isolation and signal relay buffering for the next stage of signal processing. Next, the DC bias signal from the fast buffer 212 is passed through one or more notch filters 214 as described with respect to FIG. 2. The DC bias signal is then passed through a low pass filter 716, such as a fourth order low pass filter (e.g., blocks frequencies exceeding about 55 kHz) and amplifier 218 to provide a filtered DC bias output signal 720.

The filtered DC bias output signal 720 is transferred to the fast buffer 222, which provides isolation and signal buffering for subsequent signal processing. The filtered DC bias signal 720 is then passed through a high pass filter 724, such as a fourth order high pass filter (e.g., blocks frequencies below about 230 Hz). The combination of the low pass filter 716 and the high pass filter 724 provides steeper attention in the stop band and sharper transitions around both the low cutoff frequency (e.g., 230 Hz) and the high cutoff frequency (e.g., 55 kHz) than the band pass filter 232 used in the excursion detection circuit 200.

The DC bias signal may then be passed from the high pass filter 724 through one or more notch filters 728 to provide additional filtering of noise in the DC bias signal from the chamber. For instance, turning the gas box heater 120 on and off during processing may contribute noise to the DC bias signal at a number of different frequencies. Once the specific frequencies are determined, one or more notch filters 728 can be selected to remove those specific frequencies. The filtered signal is then amplified in the amplifier 236 to provide an excursion output signal 738. The excursion output signal 738 is then fed into the comparator 240, wherein the value of the excursion output 738 is compared with the preset value 239. If the excursion output signal 738 exceeds the preset value within a specified time period, the comparator 240 passes a signal to the analog to digital converter 242 to generate the digital alarm signal 244 to flag the spike or plasma excursion. The alarm signal 244 can be fed back into the control system 150, where an operator can be alerted and/or the processing system can be shut down.

Thus, a system and method for the detection of plasma excursions, such as arcs, micro-arcs, or other plasma instability, during plasma processing by directly monitoring direct current (DC) bias voltage on an RF power electrode of a plasma processing chamber is provided. The monitored DC bias voltage is then passed through a succession of analog filters and amplifiers to provide a plasma excursion signal. The plasma excursion signal is compared to a preset value, and at points where the plasma excursion signal exceeds the preset value, an alarm signal is generated. The alarm signal is then fed back into a system controller so that an operator can be alerted and/or the processing system can be shut down. In certain embodiments, multiple processing regions can be monitored by a single detection control unit.

While the foregoing is directed to embodiments of the present invention, other and further embodiments of the invention may be devised without departing from the basic scope thereof, and the scope thereof is determined by the claims that follow.

The invention claimed is:

1. A method for detecting plasma excursions in a plasma chamber, comprising:
   directly sensing a bias voltage from a radio frequency (RF) powered electrode disposed in a gas distribution system within the plasma chamber during plasma processing;
   filtering the bias voltage using a plurality of analog filters to obtain an output voltage signal;
   comparing the output voltage signal to a preset voltage value that represents a plasma excursion event; and
   generating an alarm signal if the output voltage signal exceeds the preset voltage value.

2. The method of claim 1, further comprising reducing the bias voltage using a voltage divider prior to filtering the bias voltage.

3. The method of claim 2, wherein the filtering the bias voltage comprises passing the bias voltage through a band pass filter.

4. The method of claim 3, wherein the band pass filter is configured to only pass frequencies between about 250 Hz and about 50 kHz.

5. The method of claim 2, wherein the filtering the bias voltage comprises serially passing the bias voltage through a low frequency pass filter and a high frequency pass filter.

6. The method of claim 5, wherein the low frequency pass filter is configured to pass frequencies below about 55 kHz and the high frequency pass filter is configured to pass frequencies above about 230 Hz.

7. The method of claim 2, further comprising passing the bias voltage through a plurality of notch filters and a low pass frequency filter to obtain a filtered direct current bias voltage signal prior to obtaining the output voltage signal.

8. The method of claim 7, wherein the low pass frequency filter is configured to pass frequencies lower than 50 kHz.

9. The method of claim 1, further comprising continually collecting the output voltage signal with a data acquisition module.

10. The method of claim 1, further comprising collecting the output voltage signal with a data acquisition module only when an alarm signal is generated.

11. A system for detecting plasma excursions in a plasma chamber, comprising:
   one or more voltage probes, each voltage probe configured to attach to a radio frequency electrode within a gas distribution system in a plasma chamber and sense a bias voltage of the radio frequency electrode during plasma processing; and
   a plasma excursion detection unit, comprising:
      one or more excursion detection modules, wherein each excursion detection module is configured to receive the bias voltage from one of the one or more voltage probes, wherein each excursion detection module comprises a plurality of analog filters arranged to filter the bias voltage to obtain an output voltage signal, and wherein each excursion module further comprises a comparator configured to compare the output voltage signal to a preset voltage signal and generate an alarm signal if the output voltage signal exceeds the preset voltage signal;
      one or more connection ports configured to receive the preset voltage signal from a host controller and configured to send the alarm signal to the host controller; and
      a data acquisition module configured to collect and transfer the output voltage signal from each of the one or more excursion detection modules to a data logging and diagnostic system.

12. The system of claim 11, wherein each of the one or more voltage probes is configured to withstand temperatures up to 160° C.

13. The system of claim 12, wherein each of the one or more voltage probes comprise a voltage reducer configured to reduce the bias voltage by about a 100:1 ratio.

14. The system of claim 11, wherein each of the excursion detection modules comprises a band pass filter configured to pass frequencies between about 250 Hz and about 50 kHz.

15. The system of claim 11, wherein each of the excursion detection modules comprises a low frequency pass filter and a high frequency pass filter.

16. The system of claim 15, wherein the low frequency pass filter is configured to pass frequencies less than about 50 kHz and the high frequency pass filter is configured to pass frequencies greater than about 250 Hz.

17. The system of claim 11, wherein each of the excursion detection modules comprises a plurality of notch filters and a low pass frequency filter configured to obtain a filtered direct current bias voltage signal prior to obtaining the output voltage signal.

18. The system of claim 11, wherein the system comprises at least two voltage probes attached to separate radio frequency electrodes.

* * * * *